United States Patent [19]

Glovatsky

[11] Patent Number: 5,577,657
[45] Date of Patent: Nov. 26, 1996

[54] METHOD OF IMPROVED OVEN REFLOW SOLDERING

[75] Inventor: Andrew Z. Glovatsky, Ypsilanti, Mich.

[73] Assignee: Ford Motor Company, Dearborn, Mich.

[21] Appl. No.: 522,890

[22] Filed: Sep. 1, 1995

[51] Int. Cl.⁶ ........................................ H05K 3/34
[52] U.S. Cl. .................... 228/180.1; 228/248.1
[58] Field of Search .................. 228/42, 180.21, 228/180.1, 248.1; 219/85.17, 85.22

[56] References Cited

U.S. PATENT DOCUMENTS

| | | | |
|---|---|---|---|
| 3,926,360 | 12/1975 | Moister, Jr. | 228/248.1 |
| 4,771,929 | 9/1988 | Bahr et al. | 228/180.21 |
| 4,859,520 | 8/1989 | Debuisson et al. | 428/137 |
| 5,263,599 | 11/1992 | Moshina et al. | 228/42 |
| 5,309,545 | 5/1994 | Spigarelli et al. | 228/6.2 |

Primary Examiner—Samuel M. Heinrich
Attorney, Agent, or Firm—Joseph W. Malleck

[57] ABSTRACT

Method of efficiently reflow soldering one or more devices to a printed circuit board with a convective heating oven, each device having a plurality of plate supported electronic connecting pins that are to be soldered within respective mating openings of the printed circuit board for electronic connection, the method comprising: (i) placing a solder paste in each of the openings; (ii) assembling the device to the circuit board by positioning the plate of the device along, but spaced in relation to, the printed circuit board to define a planar space therebetween, with the pins extending into such openings and into the soldered paste to thereby form an assembly; and (iii) passing the assembly through the convective heating oven for a time period to melt the solder paste and form a solid connection upon removal of the convective heat, said passing being carried out by use of convective heat focusing features that guide the convective heat flow between the plate and board to enhance convective heating of the solder paste from both sides of the board.

11 Claims, 5 Drawing Sheets

METHOD OF IMPROVED OVEN REFLOW SOLDERING

BACKGROUND OF THE INVENTION

Technical Field

This invention relates to the technology of mounting and securing electronic connectors and components to a printed circuit board and more particularly to reflow soldering to obtain such securement.

Discussion of the Prior Art

Large mass and area devices, such as pin-in-hole connectors, present a difficult problem to achieve cost effective circuit board assembly by a single pass reflow soldering operation, in a convective oven operation. This problem results from the imperviousness and high thermal mass of the device, such as the supporting plate of the pin-in-hole connector which isolates one side of the circuit board from efficient convective heat flow. The plate supporting the pins is positioned paralleled but spaced from the circuit board, which spacing does not readily receive convective heat flow and therefore inhibits reflow soldering.

Prior art attempts to improve uniformity of heating of circuit boards in convective ovens for reflow soldering have included use of a plurality of cross-flow blowers with diverging output nozzles stationed perpendicular to and along the path of the oven conveyer (see U.S. Pat. No. 5,163,599). Unfortunately, such dedicated apparatus is not sufficient to improve the heating of solder material about the pin-in-hole connectors since they are shielded on one side usually by a closely spaced large mass/area supporting plate.

Summary of the Invention

It is an object of this invention to provide a method of oven reflow soldering that more effectively ensures high quality reflow soldered joints of pin-in-hole connectors to printed circuit boards when heated in such convective ovens.

The invention is a method of efficiently reflow soldering one or more devices to a printed circuit board within a convective heating oven, each device having a plurality of plate supported connecting pins that are to be soldered within respective mating openings of the printed circuit board for electrical connection, the method comprising: (i) placing solder paste in or over each of the openings; (ii) assembling the device to the circuit board by positioning the plate of the device along, but spaced in relation to, the printed circuit board to define a planar space therebetween, with the pins extending into such openings and into the solder paste to thereby form an assembly; and (iii) passing the assembly through the convective heating oven for a time period to melt the solder paste and form a solid connection upon removal of the convective heat, said passing being carried out by use of one or more convective heat focusing features that guide the convective heat flow between the plate and board to enhance convective heating of the solder paste from both sides of the board.

DETAILED DESCRIPTION AND BEST MODE

Figure 1:
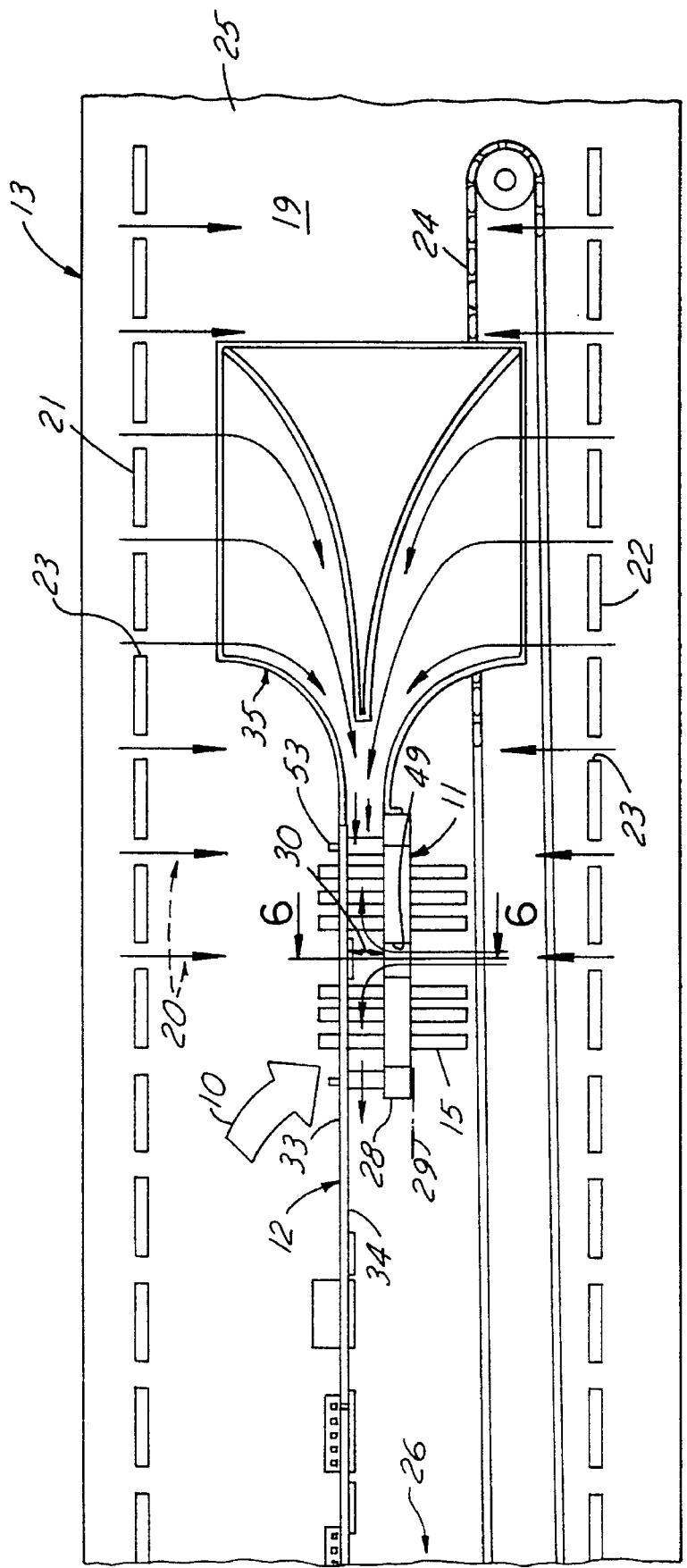
FIG. 1 is a schematic cross-sectional view of a convective heating oven through which a printed circuit board is conveyed; the view illustrating the use of convective heat flow focusing features.
Figure 3:
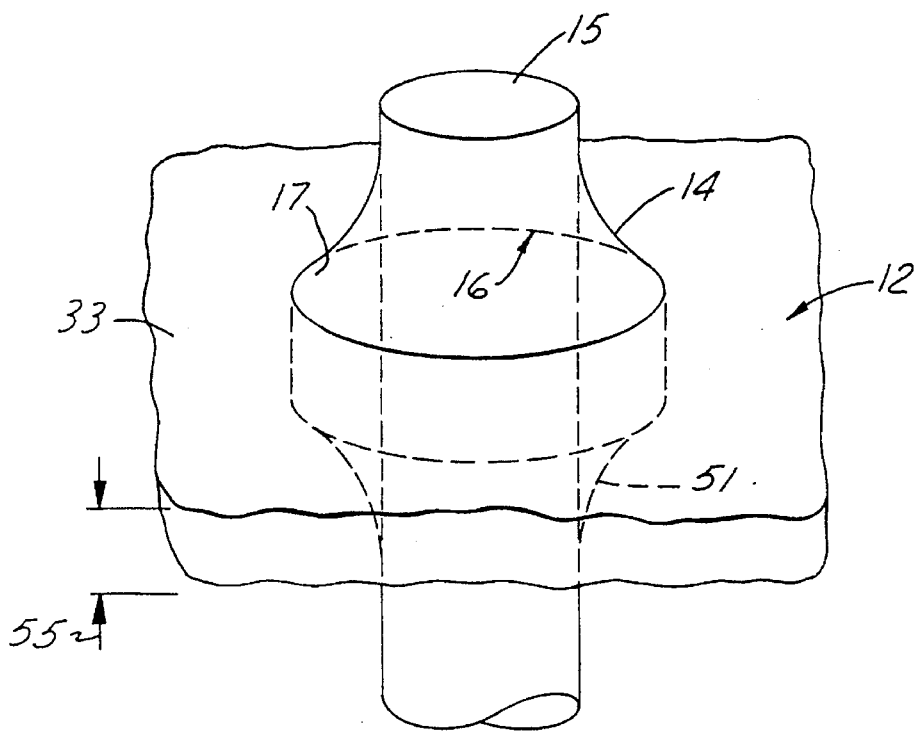
FIG. 3 is a highly enlarged fragmentary sectional illustration of a pin, the plated opening in the board receiving such pin, as well as the soldered fillet between such opening and pin in a properly formed soldered connection.

As shown in FIG. 1, reflow soldering of an assembly 10, comprised of a pin connector device 11 and a printed circuit board 12, is accomplished in a convective heating oven 13. The assembly 10 is conveyed through such oven 13 in a time period so that the solder material is heated above its melting temperature for a given period of time and forms a solder fillet 14 (see FIG. 3) about each pin 15 and forms a solid electronic connection to the edge 16 of the opening 17 (the opening in this case being a plated through hole) within which each pin is aligned to complete an electronic path 18.

The convective to flow oven 13 usually comprises an elongated heating chamber 19 throughout which a flow of heated gas 20 is generally vertically introduced from a top plenum 21 as well as from a bottom plenum 22. Each of the plenums have a plurality of openings or ports 23 through which the air flow is emitted. Although the oven gas or air flow 20 is generally vertical, some plenums can provide a slight pitch to the direction of such flow. The ovens will vary depending upon the air flow rate through such plenum ports, as well as the pitch and quantity of the plenum openings. The heated gas will flow through the openings or ports 23 of the plenums and intersect the top and bottom sides 33, 34 of the printed circuit hoard if not inhibited by some other plate or member. A conveyer 24, such as one comprised of a stainless steel mesh belt or edge conveyer, is moved through such chamber; the assemblies are placed on the conveyer at an entrance 25 of the oven and retrieved at an exit 26 within the prescribed heating time period. Typically, the furnace is operated at a temperature around 210°–220° C. for solder materials that are normally designed to melt around 180°–190° C. The solder material typically used for pin connectors is comprised of tin (Sn) and lead (Pb) solder alloys (i.e. 605•40 Pb, 635•37 Pb). the oven can also be programmed to operate at lower or higher temperature using other solder alloys.

Attaching pin connector 11, by reflow soldering within the convective reflow oven, is difficult because the pins 15 are aligned and supported on a continuous plate 28 which must be spaced from the board in a parallel plane 29 leaving a gap or space 30 therebetween which is open only at the edges of the gap and therefore not readily penetrated by the natural convective flow of the oven. As a result, the solder paste 32, positioned in the openings 17 to secure the pins, is heated unevenly and primarily from the top 33 of the printed circuit board. Very little heating takes place at the underside 34 as inhibited by the presence of the spaced connector plate; the soldered assembly will possibly contain weak joints due to improper fillet formation. A vertical flow oven fails to migrate sufficient heating flow through spacing 30 because the flow must be turned 90°.

To overcome this problem the method steps of this invention comprise: (a) placing or stenciling a soldered paste 32 in each of the openings 23 of the printed circuit board 12 adapted to receive the respective electronic connecting pins 15; (b) assembling the inn connector device 11 to the circuit board 12 by positioning the plate 28 of the device along and in spaced relation to the printed circuit board carrying the pins to define a planar space 30 therebetween while having the pins extending into the openings of the circuit board and into such soldered paste, thereby forming an assembly; (c) passing the assembly through the convective heating oven 13 for a time period to melt the soldered paste 32 and form a solid connection upon removal of the convective heat, the passing being carried on by use of one or more convective heat focusing features 35 which guide convective heat flow between the plate 28 and board 12 to enhance convective heating of the soldered paste from both sides 33, 34 of the board.

The solder paste 32 is spread onto the printed circuit board prior to assembly of the pin connector device thereto by automatic stenciling across one of the flat surfaces of the printed circuit board leaving a predetermined deposit of solder material of each opening as desired.

The convective heat focusing features comprise at least one of the following: (i) a directional flow converging tool 36 and (ii) perforations or slottings in the supporting plate 28. Turning first to the tool 36, it reflects the vertical flow 20 of the oven in a manner to converge and turn at 31 into and be aligned with the plane 29 of the gap or spacing 30 for ready entrance thereinto. The tool has side upright walls 38 welded to an upright back wall 39 to form a frame 40, between the frame is secured flow baffles 41 extending thereacross to define deflection flow channels. Top baffles 41a and 41b converge from a top opening 42 to a throat opening 43, thereby turning the flow approximately 90° from its entrance. Similarly, bottom baffles 41c and 41d converge from a bottom opening 44 to the same throat opening 43 to deflect upwardly rising convective flow to be turned again approximately 90°. The frame and flow baffles can be constructed of stainless steel sheet metal (0.010 inches thick).

Figure 2:
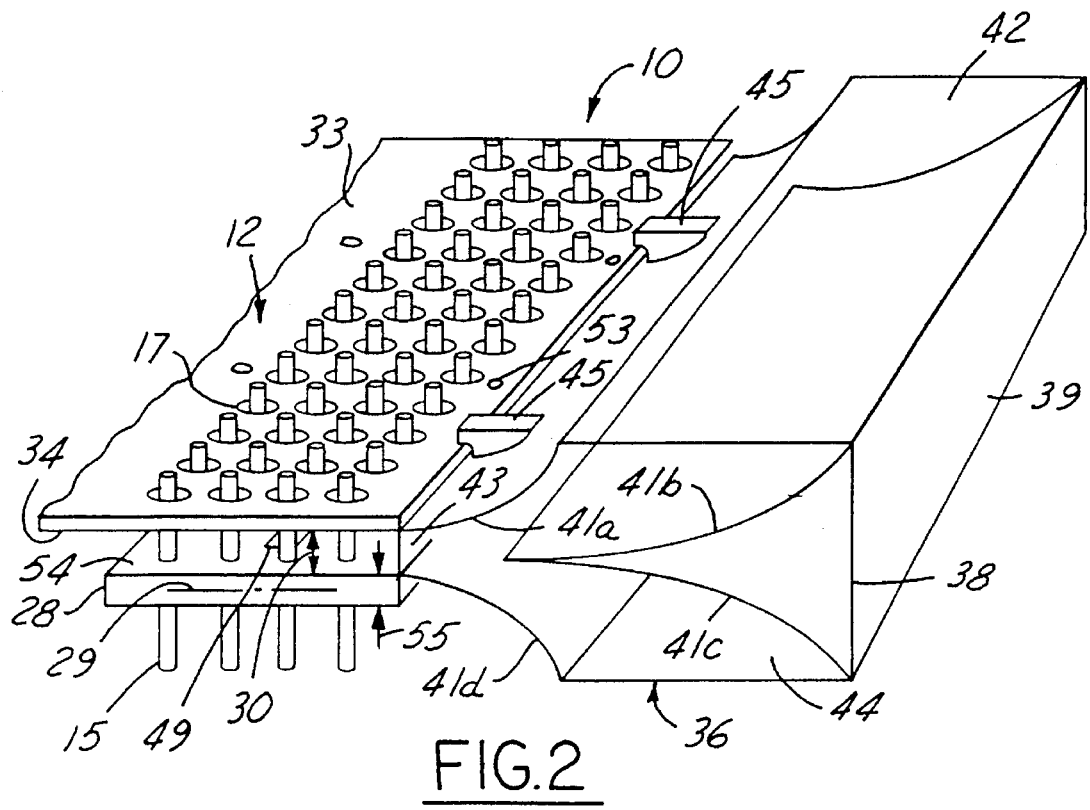
FIG. 2 is a perspective view of a portion of the printed circuit board and the heat flow focusing features of FIG. 1.

The tool 36 can be suspended on the printed circuit board 12 by use of slotted fingers 45, as shown in FIG. 2, or by use of extended slots (not shown) in the side upright walls 38 which need to be extended forward of the baffles. Use of the fingers 45 or slots require placement of the tool on the printed circuit board prior to or at the same time as placement of the assembly onto the conveyer. Alternatively, the tool may be hinged to the conveyer 24 so that it is easily aligned with the assembly 10 when the assembly is placed in abutting relation to the tool on the conveyer.

Figure 4:
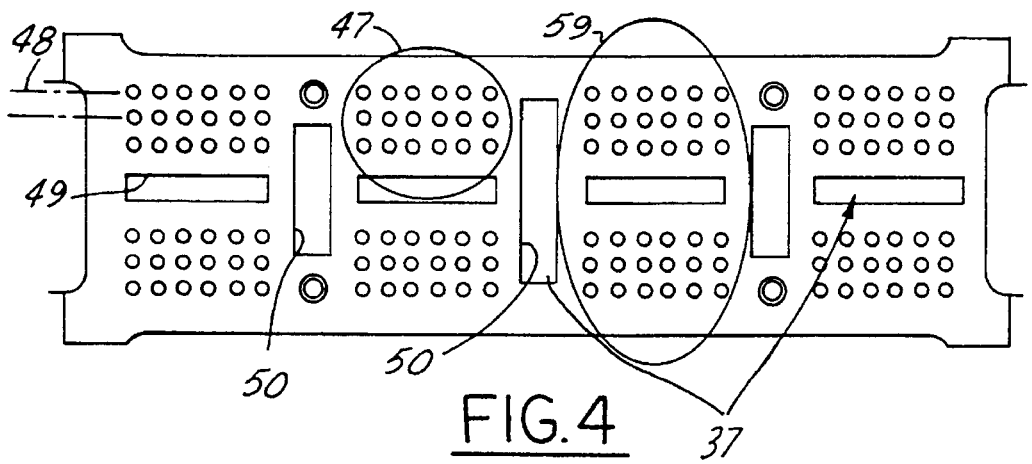
FIG. 4 is a slightly enlarged plan view of the connector plate and pins of FIG. 1.
Figure 5:
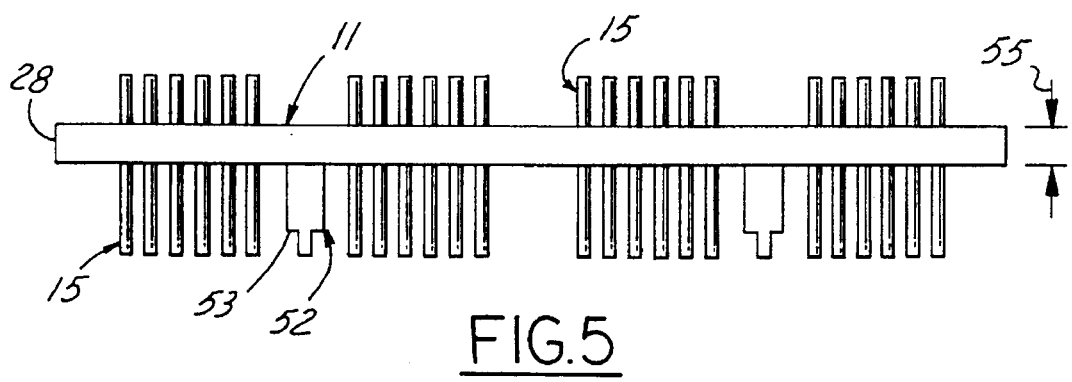
FIG. 5 is a frontal cross-sectional elevational view of the connector plate and pin configuration of FIG. 4.

Alternatively or additionally, the convective heat focusing feature may comprise perforations, slots or openings 37 (see FIGS. 1, 4, 6, and 7B) provided through the supporting plate 28 of the pin connector device. Preferably, the slots will divide the pins into groupings 47 that limit the thermal mass and thereby enhance rapid heating by the redirected heat flow 31. As shown in FIGS. 4 and 5, larger slots 50 extending transversely of the supporting plate, divide the pins into groups that have about six pins in a longitudinal row 48. Slots 49, which are slightly narrower and extend longitudinally, divide the pins into groups containing up to three rows, (preferably only two rows). The vertically directed convective heat flow 20 will easily reach the solder paste from the top side 33 of the printed circuit board, as shown in FIG. 4, but more importantly, the convective flow from the bottom which normally would be inhibited can now migrate through the transverse and longitudinal openings 49, 50 to reach the underside 51 of the solder paste and promote effective rapid uniform heating. Such heating may now approximate without the presence of a pin supporting plate. Preferably, the openings have an opening area at least 10 mm$^2$ or greater.

Figure 6:
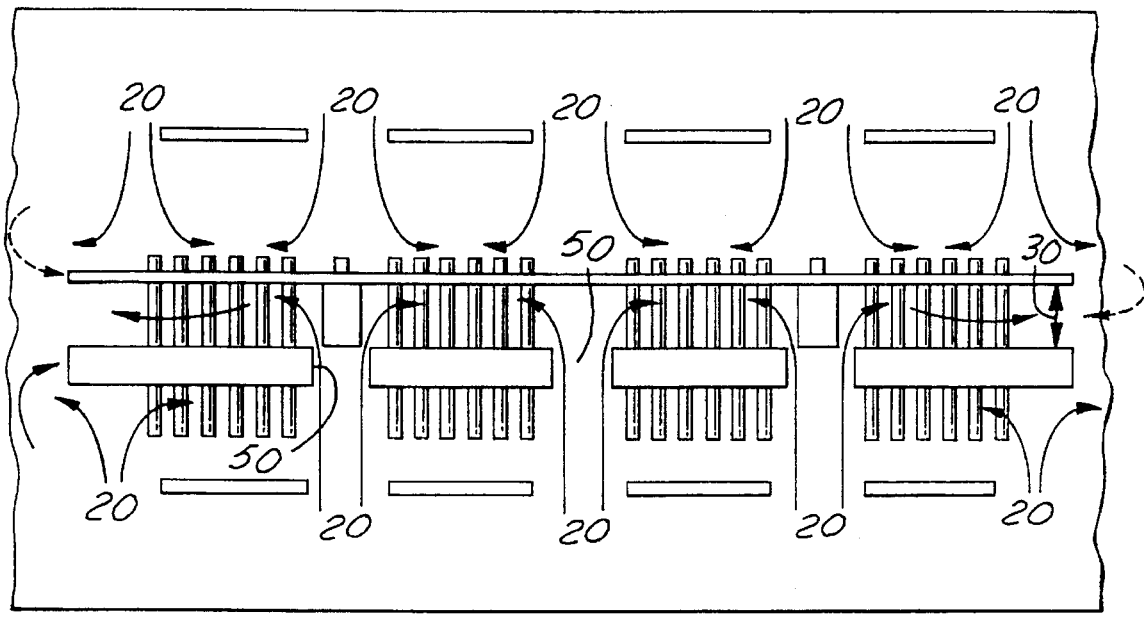
FIG. 6 is an end view of a portion of the assembly in FIG. 1.
Figure 7A:
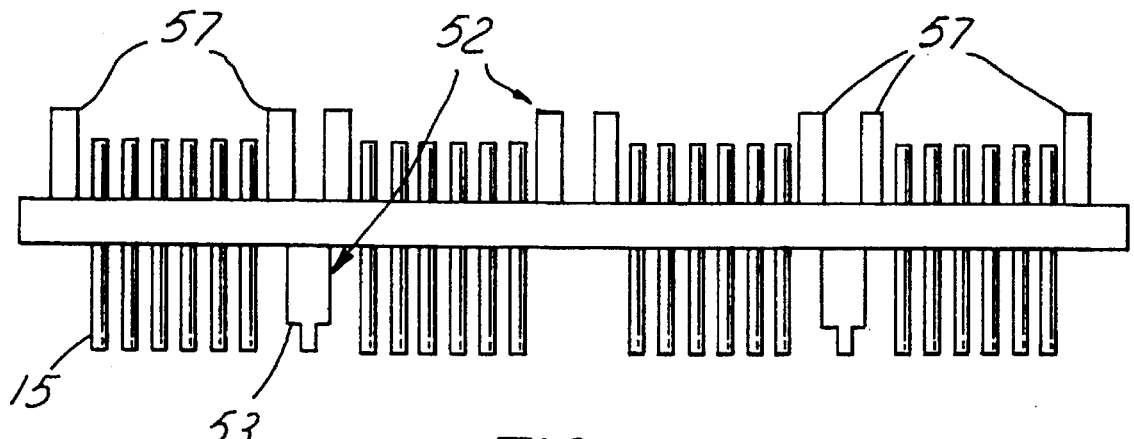
FIGS. 7A and 7B are respectively an elevational side view and a plan view of a pin connector showing the use of corner guides facilitating the insertion of mating connector features.

To facilitate uniform heating, auxiliary structure aids 52 may be used in the form of spacing guides 53 (shoulders protruding from the side 54 of the supporting plate 28 which faces the circuit board 12) that limit the extent the pins 15 protrude through the openings and also fixes the dimension of spacing 30 between the printed circuit board and plate (see FIGS. 6 and 7A). Preferably, such spacing shouht be in the range of 0.025 to 0.250 inches. The plate itself may also be limited in a thickness 55 to the range of 0.025 to 0.50 inches, to thereby limit its insulative effect and facilitate more rapid uniform heating of the solder paste. It is desirable that the cycle time, measured from the moment of inserting the assembly into the heating oven to the time it is extracted from the heating oven, less than 12–18 minutes.

Figure 7B:
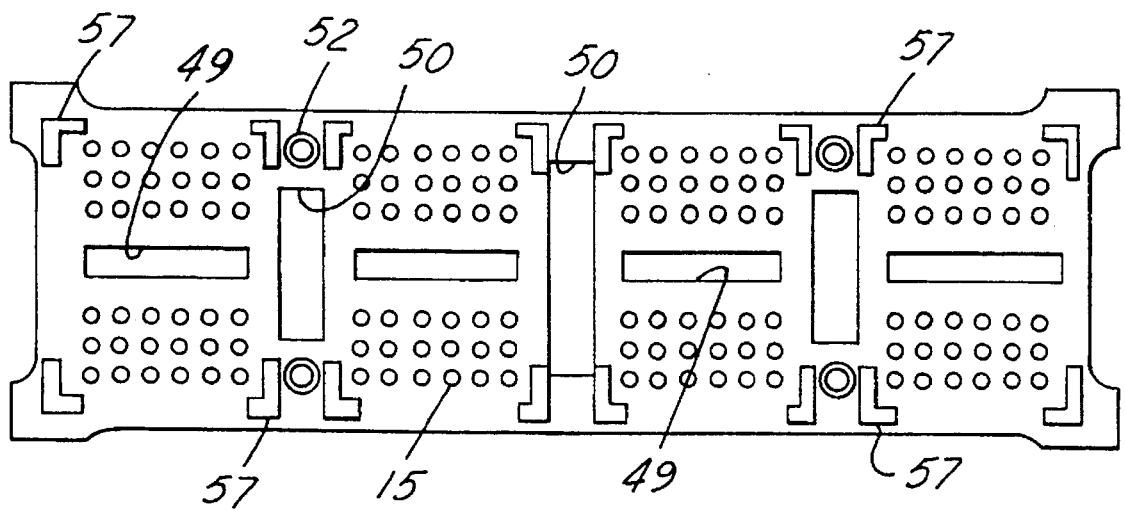
Figure 8A:
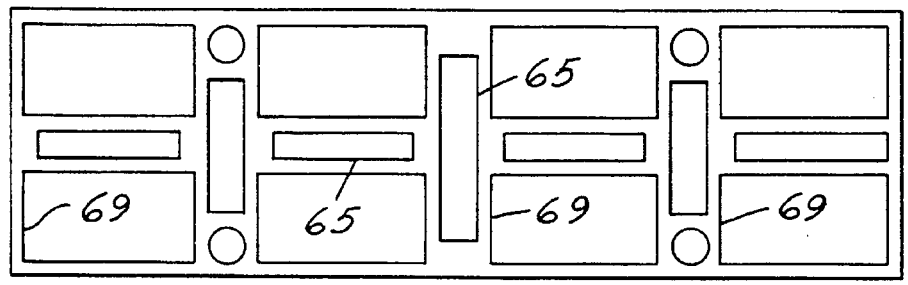
FIGS. 8A and 8B are respectively plan and elevational views of a frame adapted to be attached to the connector plate, such frame carrying (i) four pocket protection walls for receiving mating connectors to the device and (ii) a series of sealing members for closing off the openings in the connector plate.
Figure 8B:
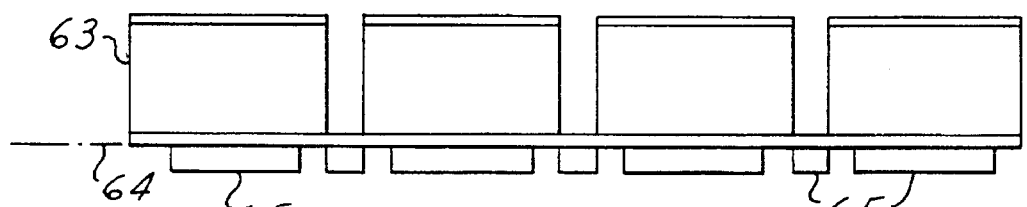

In the ordinary use of printed circuit boards possessing pin connectors, it is desirable to facilitate insertion of mating connectors to the pins by use of guide pockets or walls. Such guide walls have been heretofore integrally formed as part of the pin support plate and have thus inhibited uniform heating of the solder paste when it is passed through the convective heat flow oven. The support plate 28 of this invention is preferably flat, possessing a thickness that is thinner than normal, and is a single monolithic substrate comprised usually of a thermoplastic or thermoset polymer, such as PBT (Polybutylene terephthalate) and Novalac epoxy, respectively; it is devoid of any projecting guide walls. However, integral guides, if needed, can be formed as winged guide posts 57 located as each corner 58 of the pin groupings (such as grouping 59 separated by transfers slots 50) as shown in FIGS. 7A and 7B. Such guide posts are integral to the plate 28 and will not significantly affect the uniform heating of the solder paste as the assembly is passed through the convective heating oven.

Figure 9A:
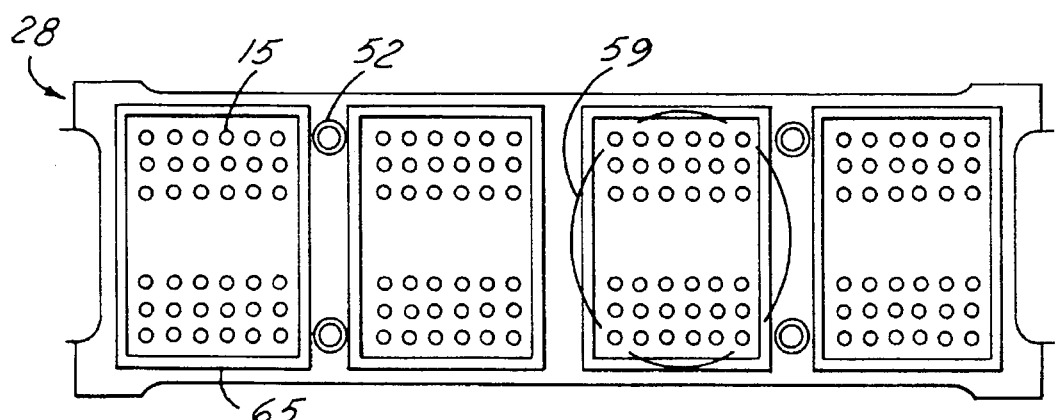
FIGS. 9A and 9B are respectively plan and elevational views of the assembled combination of the frame of FIGS. 8A–B and the pin-in-hole connector device of FIG. 1.
Figure 9B:
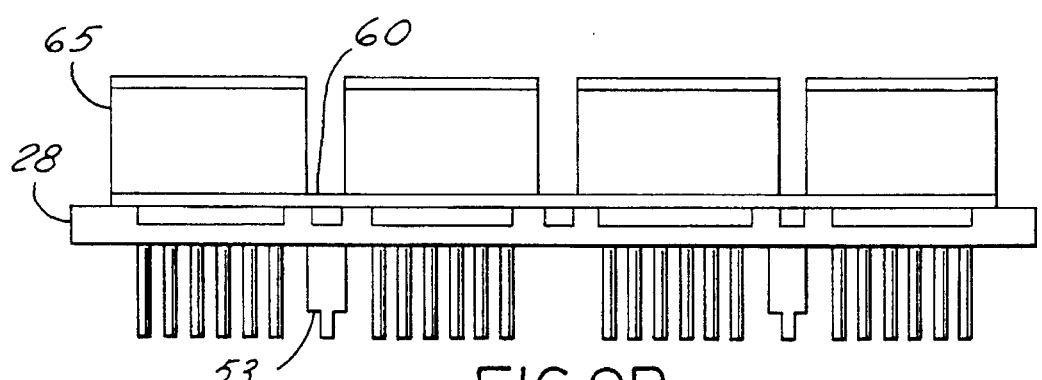

If, in some cases. it is desirable to provide greater rigidity and strength for the support plate during use, a guide frame 60 can be added as a post soldering procedure (see FIGS. 9A–9B). A separate insulative frame 60 is designed to fit onto the bottom side of the plate 28 and surround the pins 15 extending therethrough. The frame carries a series of annular closed guide cups or pockets and has openings 62 aligned with the pin grouping 59; guide walls 63 extend from the plane 54 of the frame to surround the inn grouping (such as grouping 59 which are divided by transfers slots 50). The frame 60, in addition, may also carry sealing element or pad 65 that, upon placement of the frame in the position onto the support plate, will snugly close off the openings 49, 50 in the connector plate 28 and restore the plate structurally to a continuous non-interrupted plate. If a sealing element or pad is not adequate, an adhesive can be used to bond the frame 60 directly to the base plate 28, creating a hermetic (water tight) seal and proving added mechanical integrity to the assembled connector.

By reducing tim cycle time at which reflow soldering of pin connectors takes place with this invention, printed circuit boards may now also reflow solder regular electronic components at the same time. Electronic components as well as pin connector devices may be soldered all in the same oven pass and cycle time. This is a significant increase in productivity capability without sacrificing the reliability and integrity of the solder joints.

While particular embodiments of the invention have been illustrated and descried, it will be obvious to those skilled in the art that various changes and modifications may be made without departing from the invention, and it is intended to cover in the appended claims all such modifications and equivalents as fall within the true spirit and scope of this invention.

We claim:

1. A method of efficiently reflow soldering one or more devices to a printed circuited board within a convective heating oven, each device having a plurality of plate supported connecting pins that are to be soldered within respective mating openings of the printed circuit board for electrical connection, the method comprising:

(a) placing a solder paste in each of said openings;

(b) assembling said device to the printed circuit board by positioning the plate of the device along, but in spaced relation to, the printed circuit board to define a planar space therebetween, with the pins extending into said openings and into said solder paste to thereby form an assembly; and (c) passing said assembly through the convective heating oven for a time period to melt the solder paste and form a solid connection upon removal of the convective heat, said passing being carried out by use of one or more convective heat; focusing features that guide convective heat flow between said plate and printed circuit board to enhance convective heating of the solder paste from both sides of the printed circuit board.

2. The method as in claim 1, in which said convective heat focusing feature comprises of at least one of (i) a directional flow converging tool associated with said assembly to deflect convective heat flow into the spacing between the plate and printed circuit board, and (ii) one or more openings in said plate between said pins to more readily allow migration of convective heat flow into said spacing.

3. The method as in claim 2, in which said heat focusing feature is said tool and said tool is attached to said printed circuit board to deflect heat flow into said spacing.

4. The method as in claim 2, in which said focusing feature is said tool and said tool is hinged to the conveyer of said oven so that said assembly may be place. d in abutting relation to the tool deflecting heat flow into said spacing as the assembly passes through the oven.

5. The method as in claim 2, in which said focusing feature is a plurality of openings in said plate, said openings dividing said pins of said connector rate groups of predetermined metal mass to enhance rapidity of heating of the solder about each pin.

6. The method as in claim 5, in which said openings have a cross-sectional area of at least 10 square millimeters.

7. The method as in claim 5, in which said openings are spaced from the pins a maximum distance in the range of 0.25 to 0.50 inches.

8. The method as in claim 1, in which said device has a plurality of standoff shoulders extending from the plate to abut and control the spacing between with said printed circuit board.

9. The method as in claim 8, in which the plate of said device has a uniform thickness in the range of 0.25 to 0.50 inches.

10. The method as in claim 5, in which said device is formed with a plurality of guide posts protruding from the plate m a direction opposite to said printed circuit board to facilitate the guidance of mating connectors, said guide posts being placed at the corners of said pin groupings.

11. The method as in claim 2, in which said method further comprises step (d) of planting a frame on the solderer assembly, said frame carrying sealing elements that close off any openings in said plate and provide guide cups surround each of the pin groups, said frame being secured to said device after completion of reflow soldering.

* * * * *

UNITED STATES PATENT AND TRADEMARK OFFICE
CERTIFICATE OF CORRECTION

PATENT NO. : 5,577,657
DATED : November 26, 1996
INVENTOR(S) : Glovatsky

It is certified that error appears in the above-identified patent and that said Letters Patent is hereby corrected as shown below:

Column 2, line 3, delete " 3 is a highly" and insert -- 3 is an --

Column 2, line 3, delete "sectional"

Column 2, lines 3-4, "illustrations" should read -- illustration --

Signed and Sealed this

Ninth Day of February, 1999

Attest:

Attesting Officer

*Acting Commissioner of Patents and Trademarks*